US005780963A

United States Patent [19]

Matsuoka et al.

[11] Patent Number: 5,780,963

[45] Date of Patent: Jul. 14, 1998

[54] DEFLECTION YOKE

[75] Inventors: Makoto Matsuoka, Kouchi; Takasuke Koga, Moriyamachi, both of Japan

[73] Assignee: Victor Company of Japan, Ltd., Yokohama, Japan

[21] Appl. No.: 806,736

[22] Filed: Feb. 27, 1997

[30] Foreign Application Priority Data

Feb. 29, 1996 [JP] Japan .................................... 8-071001

[51] Int. Cl.[6] ........................................ H01J 29/76

[52] U.S. Cl. .......................... 313/440; 313/437; 335/210; 335/212

[58] Field of Search .................................... 313/440, 433, 313/437, 431; 335/210, 212; 348/829

[56] References Cited

U.S. PATENT DOCUMENTS 4,570,140 2/1986 Teruaki .................................. 313/431
5,227,753 7/1993 Hirai et al. .............................. 313/431
5,289,149 2/1994 Nishita et al. .......................... 335/212

FOREIGN PATENT DOCUMENTS 7-87503 3/1995 Japan .

*Primary Examiner*—Nimeshkumar Patel
*Attorney, Agent, or Firm*—Michael N. Meller

[57] ABSTRACT

A deflection yoke is comprised of a pair of separators 1*a*, 1*b*. A cylindrical neck 3 is formed on the pair of separators. Magnetic rings 7, 8, 10, 11 are installed on the neck. A spacer 19 is inserted between the magnet rings 8 and 10. A clamp band 5 is installed on the cylindrical neck, and fastens the deflection yoke to a neck of a cathode ray tube. The spacer has protuberances 19*a*, 19*b*. Projections 20*a*, 20*b* are formed on the pair of separators so as to engage with the protuberances for restricting rotation of the spacer.

9 Claims, 10 Drawing Sheets

DEFLECTION YOKE

BACKGROUND OF THE INVENTION

1. Field of the invention

The present invention relates to a deflection yoke for an in-line type cathode ray tube (CRT), and particularly to a deflection yoke having a plurality of magnetic rings at an end of the deflection yoke for setting magnetic fields for the CRT, such as for convergence and purity.

2. Description of the Related Art

A deflection yoke for an in-line type CRT (cathode ray tube) has a plurality of magnetic rings each having plural poles, such as dipole, quadrapole or more poles at the rear end of the CRT. Display characteristics of the CRT, such as convergence, purity are adjusted by turning these magnetic rings.

An adjusting mechanism of the magnetic rings of the related art is explained referring to FIGS. 1 through 4.

FIG. 1 shows a partial perspective view of a prior art deflection yoke.

FIG. 2 shows a partial exploded view of FIG. 1.

FIG. 3 shows a sectional view of a part of a neck, near to the CRT, of the deflection yoke of the FIG. 1.

FIG. 4 shows a sectional view, taken along the X-Y plane of the neck of the deflection yoke of FIG. 1.

In FIGS. 1 and 2, the deflection yoke is comprised of a pair of separators 1a, 1b of a funnel shape, a pair of horizontal deflection coils (not shown) under the pair of separators 1a, 1b, a pair of vertical coils (not shown) over the pair of separators, and a pair of cores 2a, 2b. Here, only an area of a pair of flanges 16a, 16b of the separators 1a, 1b, facing a rear of the CRT, is shown, and other parts having the funnel shape are omitted for simplicity.

A neck 3 of a cylindrical shape having tongues 3a through 3f is integrally formed with the pair of flanges 16a, 16b.

The neck 3 is flexible inward as slits 4a through 4f are provided thereon. A clamp band 5 for fixing the deflection yoke to a neck of the CRT is provided on the neck 3. A screw 6, screwed to the clamp band 5, fastens the deflection yoke to the neck of the CRT by tightening the clamp band 5 about the neck 3.

Magnetic rings 7, 8, 10, 11 each having multiple magnetic poles are provided between the clamp band 5 and the flange of the pair of separators 1a, 1b. A spacer 9 is inserted between the magnetic rings 8 and 10. More precisely, protrusions 12a, 12b, flexible in the direction of the Z axis, are provided at the bottom of the neck 3. On the tongues 3c, 3f of the neck 3, hooks 13, 13 having claws 13a, 13a of triangular shape at their distal ends are formed. The hooks 13, 13 are inwardly flexible. The magnetic rings 7, 8, 10, 11 are inserted from the rear side of the deflection yoke, about the neck 3 having a cylindrical shape, between the protrusions 12a, 12b, and the claw 13a.

Prominences 14, 14 are formed on the upper areas of the tongues 3c, 3f for engaging with holes 5a, 5b of the clamp band 5 respectively. The prominence 14 is sloped away from the neck 3 and toward the bottom thereof. The hooks 13, 13 have flexibility as mentioned before. Accordingly, the magnetic rings 7, 8, 10, 11 and the spacer 9 are easily set to a predetermined position of the neck 3.

Ribs 15a, 15b, provided on both sides of each of the hooks 13, 13 restrict downward movement of the magnetic rings 7, 8, 10, 11 and the spacer 9 in order to prevent the protrusions 12a, 12b from being crushed.

For example, the magnetic rings 7, 8 are dipole magnets, and the magnetic rings 10, 11 are quadrapole magnets. Purity control of the CRT is performed by tuning mutual angular position of the magnetic rings 7 and 8, and their angles with respect to the deflection yoke. Convergence control of the CRT is performed by tuning the mutual angular positions of the magnetic rings 10 and 11, and their angles with respect to the deflection yoke. Tuning operation is performed manually by turning tabs 7a, 8a, 10a and 11a of the magnetic rings 7, 8, 10 and 11 respectively.

Accordingly, each of the magnetic rings 7 and 8, and the magnetic rings 10 and 11 is required to move independently, and temporarily settled at their optimum positions. After completion of the tuning operation, the magnetic rings 7, 8, 10 and 11 are fixed by applying an adhesive thereon.

For this purpose, the protrusions 12a, 12b and the claw 13a are designed, and the spacer 9 is provided as explained below.

Upper and lower limits of torque for rotating and settling the magnetic rings 7, 8, 10 and 11 are prescribed. As shown in FIG. 3, a space L1 between the protrusion 12a (12b) and the claw 13a is designed to be a little smaller than the total thickness of the magnetic rings 7, 8, 10 and 11, and the spacer 9, so as to obtain the adequate torque for rotating the magnetic rings 7, 8, 10 and 11. The torque results from the friction between the respective magnetic rings 7, 8, 10, 11, which are caused by a rear spring action of elasticity of the protrusion 12a (12b).

As shown in FIGS. 2 and 4, the spacer 9 has dowels 9a, 9b formed inwardly, which fit in slits 4a, 4d of the neck 3 to be prevented from rotating. FIG. 4 shows a sectional view of the neck 3 and the spacer 9, where the X-axis represents a line passing perpendicular to the center of the neck of the CRT, and the Y-axis shows the vertical axis thereof.

The spacer 9 is interposed between a pair of the magnetic rings 7, 8 and pair of the magnetic rings 10, 11 so as to prevent the rotation of one pair interfering with the rotation of the other pair. As a result, each pair of the magnetic rings 7, 8 and 10, 11 may be rotated independently.

The deflection yoke of the prior art mentioned above has problems as described below.

The deflection yoke of the prior art is mounted on a cathode ray tube (CRT) by fastening the clamp band 5. As shown in FIG. 5, the clamp band 5 is set about the neck 3, and the deflection yoke is installed on the CRT by turning the screw 6 of the clamp band 5.

Accordingly, when the neck 3 is tightened by the clamp band 5, the widths of the slits 4a to 4f, become narrower as shown in FIGS. 6(A) and 6(B).

A tuning operation of purity or of convergence of the CRT is performed by rotating the pair of the magnetic rings 7, 8 or the pair of the magnetic rings 10, 11. In either case of tuning, when one of the magnetic rings of the pair 7, 8 (10, 11) is rotated, the other ring of the pair is preferably fixed in its original position. An adequate rotational torque force is needed for tuning respective magnetic rings 7, 8, 10 and 11. For this purpose, it is desirable that the clearances of the magnetic rings 7, 8, 10 and 11, and the spacer 9 be restricted by the protrusions 12a, 12b and the claw 13a in the direction of Z axis.

Accordingly, the dowel 9a (9b) on the spacer 9, having a width "d" and engaging the slit 4a (4b), is desirably free in the direction of the Z axis and restricted from turning in the slit 4a (4b) which is narrowed to have a width W1 (see FIG. 6(B)).

Actually, the width W of the slit 4a (4d) is changed for many reasons such as a variation of the thickness of the neck 3 which corresponds to the extent of narrowing extent of the neck 3, a variation of the diameter of the neck of the CRT on which the deflection yoke is mounted, a variation of the diameter of the neck caused by the number of tape wrappings thereon, and a variation of the settled position of the dowel 9a (9b) in the direction of the z-axis caused by a variation of the total thickness of the magnetic rings 7, 8, 10, 11 and the spacer 9.

When the width "d" of the dowel 9a (9b) is set to be larger than the width W1 of the slit 4a (4d), because of the reasons explained the above, the dowel 9a (9b) is pushed downwards by the neck 3, and the torque of the magnetic rings 7, 8, 10 and 11 will deviate from the adequate value. Further, the deflection yoke will be fixed securely to the neck of the CRT, as the slits 4a through 4f may not be narrowed enough by the fastening of the clamp band 5.

Therefore, for the reasons explained above, the width "d" of the dowel 9a (9b) is designed to be smaller than the width W1 of the slit 4a (4d). Accordingly, a space defined by "W1–d" allows some degree of rotation of the spacer 9 around the neck of the CRT. The random variation of this space defined by "W1–d" is caused by both of the variations of the width W1 of the slit 4a (4d) and the width d of the dowel 9a (9b).

As a result, when one pair of the magnetic rings is tuned up, another pair of the magnetic rings is influenced by its tuning action, and rotated because the space "W1–d" is generally too large to suppress the influence. For example, when tuning of convergence is performed after the tuning of purity of the CRT, it is required that the magnetic rings 7, 8 are tuned again, because the magnetic rings 7, 8 are influenced by the tuning action of the other magnet rings 10, 11. Thus, the magnetic rings 7, 8 have to be tuned again. And, moreover, in a display monitor production process, every deflection yoke has to be tuned in a different way, because the space "W1–d" differs from each other. Thus, the productivity of the mounting process of the deflection yoke is decreased.

SUMMARY OF THE INVENTION

Accordingly, a general object of the present invention is to provide a deflection yoke which can be tuned smoothly for purity and convergence of a CRT by turning magnetic rings for adjusting magnetic field.

Another object of the present invention is to provide a deflection yoke comprised of a clamp mounted on a cylindrical neck of a pair of separators, a plurality of magnetic rings mounted on the cylindrical neck for tuning the magnetic field, a spacer mounted on the cylindrical neck and placed between the magnetic rings, wherein the deflection yoke is mounted on a neck of a CRT by clamping the clamp, and rotation of the spacer is restricted by engaging with a catch formed on a place which is not distorted by a clamping force of the clamp.

DETAILED DESCRIPTION OF THE PREFERRED EMBODIMENTS

Figure 1:
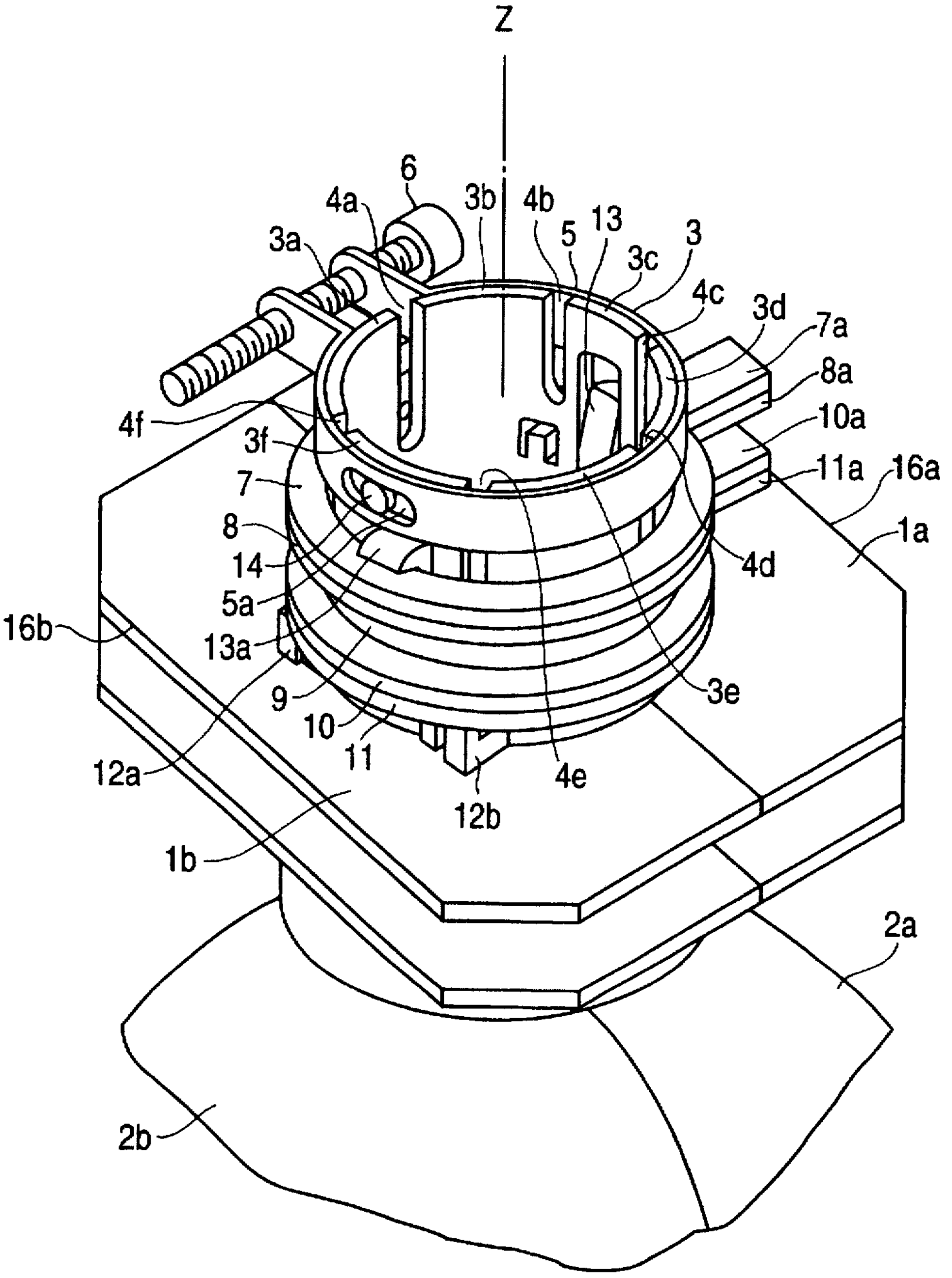
Fig. 1 PRIOR ART
FIG. 1 shows a partial perspective view of a prior art deflection yoke.
Figure 2:
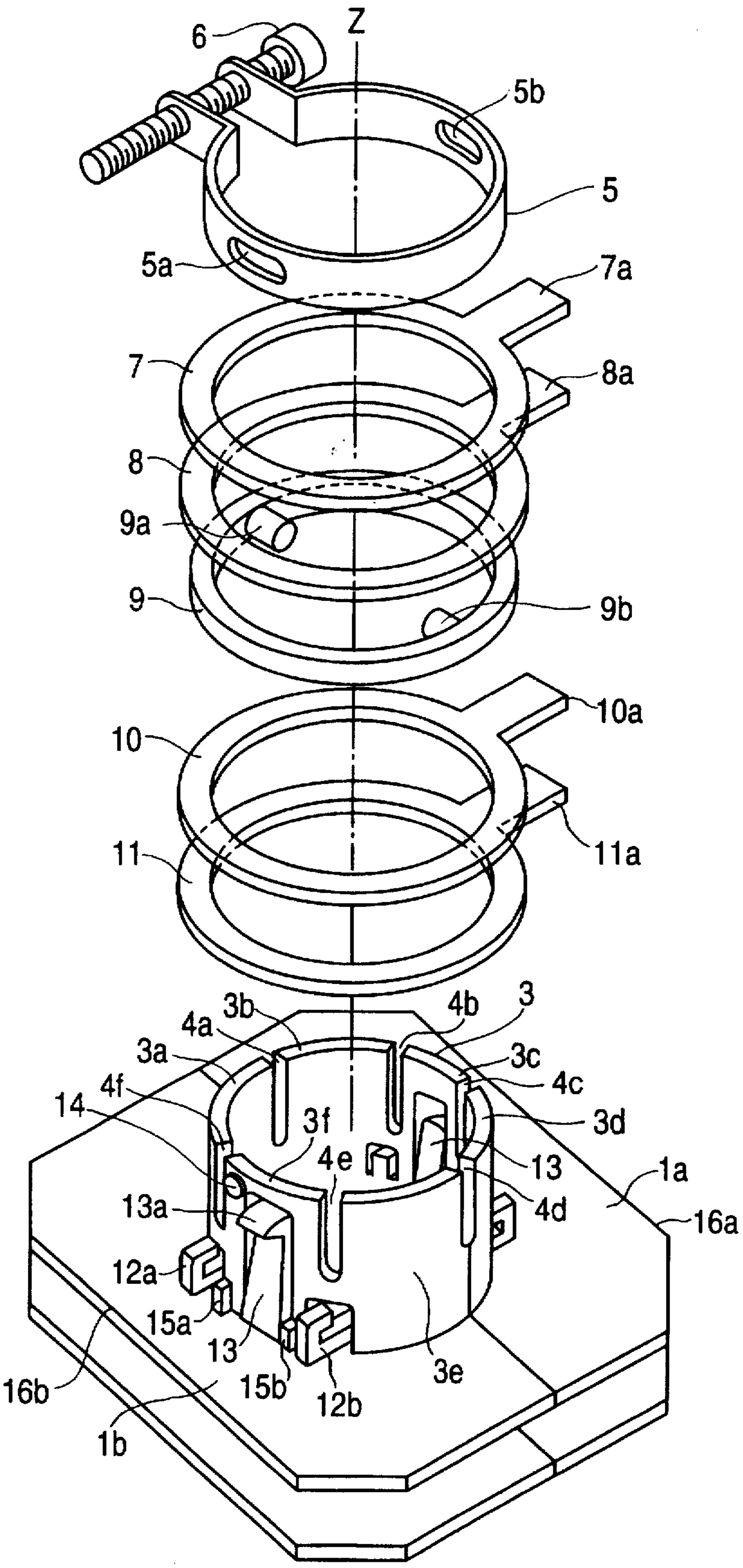
Fig. 2 PRIOR ART
FIG. 2 shows a partial exploded view of the deflection yoke of FIG. 1.

A deflection yoke incorporating the principles of the present invention will be described in detail with reference to the accompanying drawings, in which the same reference numerals and symbols are used to denote like or equivalent elements used in the aforementioned prior art deflection yoke, and detailed explanation of such elements are omitted for simplicity.

[1st Embodiment]

An explanation will be given for a first embodiment of the present invention.

Figure 7:
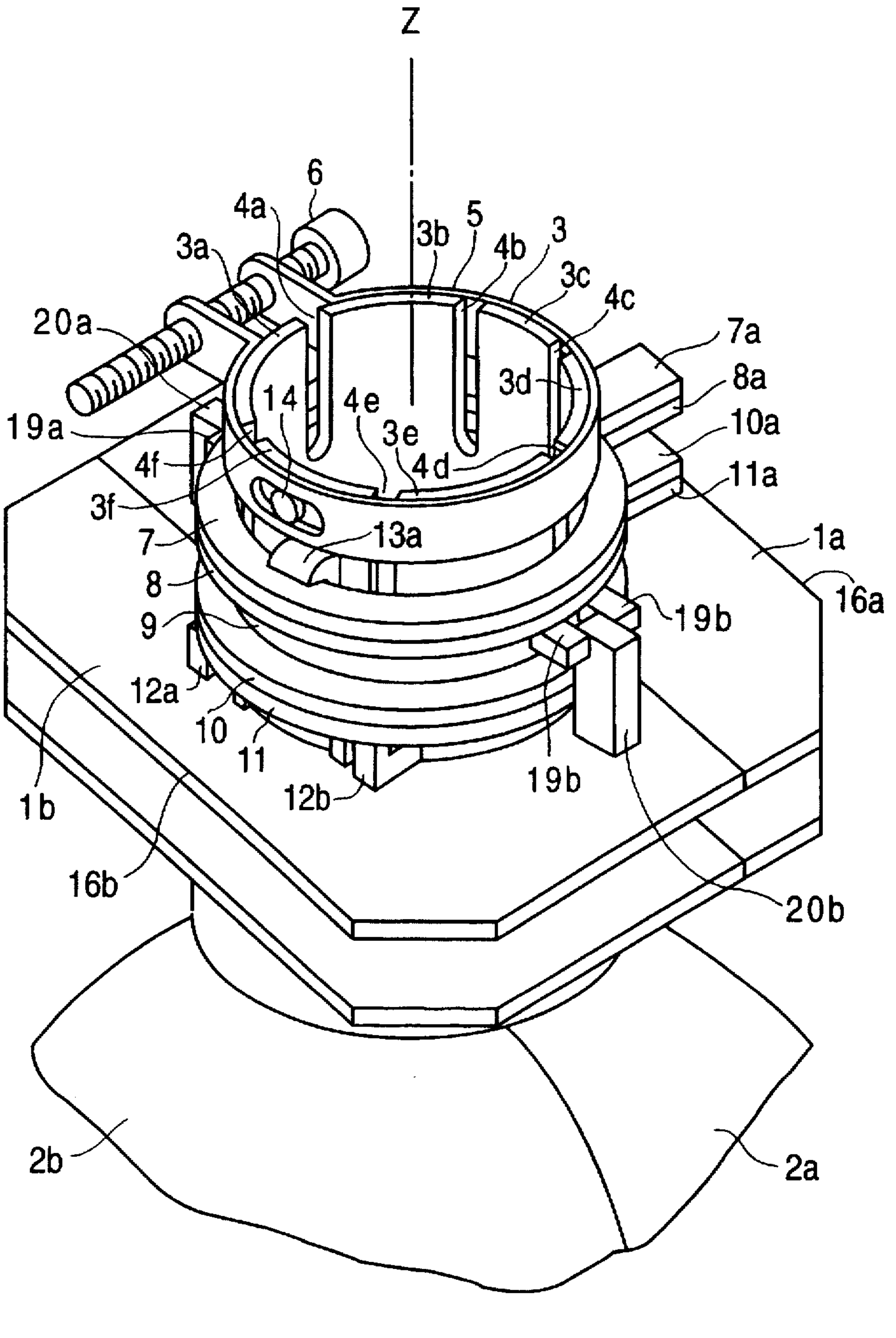
FIG. 7 shows a partial perspective view of a deflection yoke of a first embodiment of the present invention.

FIG. 7 shows a partial perspective view of a deflection yoke of a first embodiment of the present invention.

Figure 8:
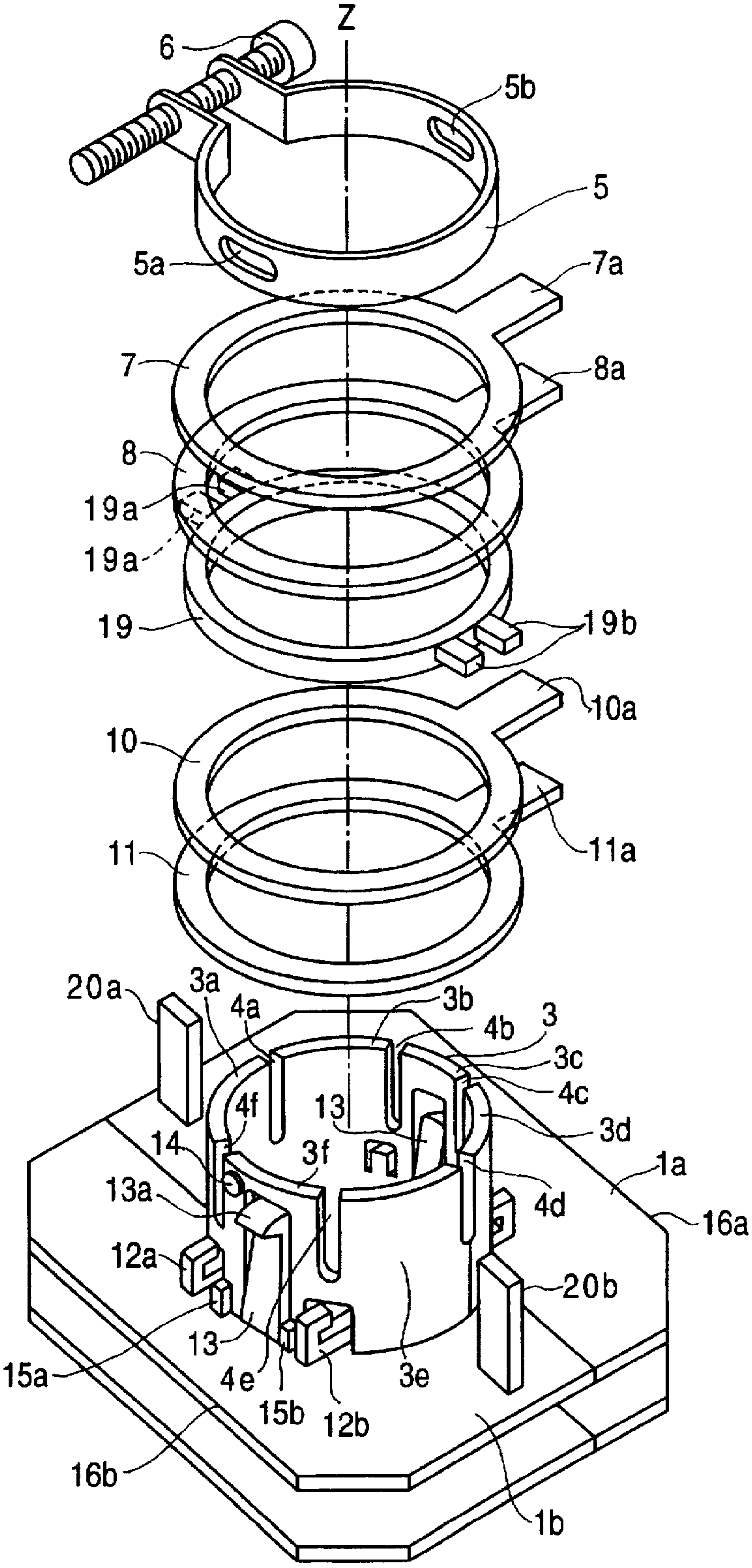
FIG. 8 shows a partial exploded view of a deflection yoke of the 1st embodiment of the present invention.

FIG. 8 shows a partial exploded view of a deflection yoke of the 1st embodiment of the present invention.

Figure 9:
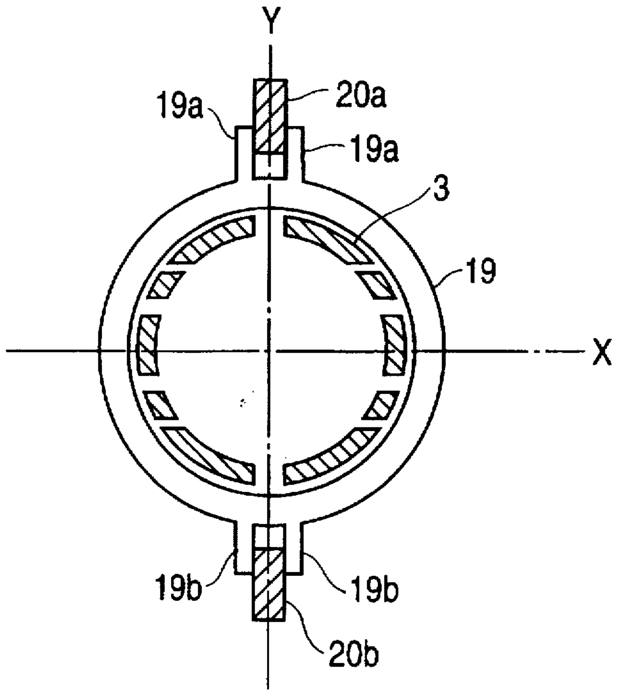
FIG. 9 shows a partial sectional view of a deflection yoke of a first embodiment of the present invention.

FIG. 9 shows a partial sectional view of a deflection yoke of the first embodiment of the present invention.

Figure 10A:
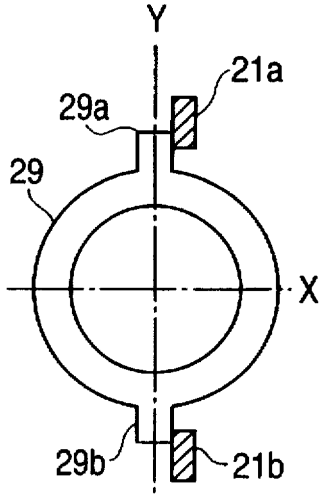
FIGS. 10(A) through 10(C) show partial sectional views of the 1st embodiment of the present invention.
Figure 10B:
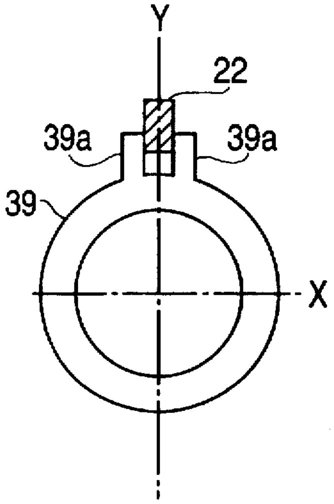
Figure 10C:
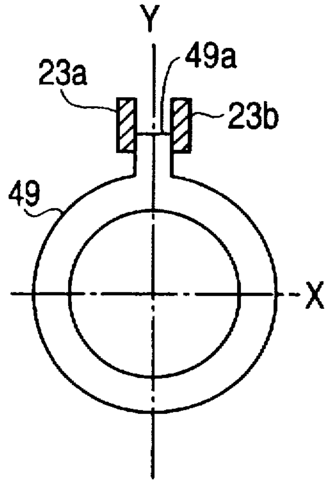

FIGS. 10(A) through 10(C) show partial sectional views of the 1st embodiment of the present invention.

FIGS. 7 and 8 show a deflection yoke for a cathode ray tube (CRT), which is comprised of a pair of separators 1a, 1b formed in a funnel shape, a pair of horizontal deflection coils (not shown) set under the pair of separators 1a, 1b, a pair of vertical deflection coils (not shown) set over the pair of separators 1a, 1b, and cores 2a, 2b set above the pair of deflection coils (not shown). FIGS. 7 and 8 show a part of the pair of separators 1a, 1b, such as a pair of flanges 16a, 16b, which is positioned near the rear of CRT. Other parts of the pair of separators 1a, 1b of a funnel shape are positioned toward a screen of the CRT, but are omitted for simplicity.

A neck 3 of cylindrical shape having tongues 3a through 3f is formed integrally with the pair of flanges 16a, 16b.

The neck 3 is flexible inwardly as it has slits 4a through 4f. A clamp band 5 is set about the neck 3, for clamping the deflection yoke to the neck of the CRT. The clamp band 5 has a screw 6, and is tightened by turning the screw 6. Thus, the slits 4a through 4f of the neck 3 are narrowed thereby, and the deflection yoke is installed in the neck of the CRT.

Magnetic rings 7, 8, 10, 11 each having multiple magnetic poles are provided between the clamp band 5 and the pair of flanges 16a, 16b. A spacer 19 of a ring shape is inserted between the magnetic rings 8 and 10. The spacer 19 of the first embodiment of the present invention differs in shape from the spacer 9 of the prior art.

Protrusions 12a, 12b, flexible in the direction of the Z axis, are provided at the bottom of the neck 3. Hooks 13, 13 having claws 13a, 13a of triangular shape at their distal ends are formed on the tongues 3c, 3f of the neck 3 respectively. The hooks 13, 13 are flexed inwardly when a force is applied on the claws 13a, 13a in the direction of the Z axis. The magnetic rings 7, 8, 10, 11 are inserted from the rear side of the deflection yoke, on the neck 3, between the protrusions 12a, 12b, and the claw 13a.

Prominences 14, 14 are formed on the rear areas of the tongues 3c, 3f respectively. The prominence 14 is sloped away from the neck 3 and toward the bottom thereof. The hooks 13, 13 have flexibility as mentioned before. Accordingly, the magnetic rings 7, 8, 10, 11 and the spacer 9 are easily set to the predetermined position of the neck 3.

Ribs 15a, 15b, provided on both side of the hooks 13, 13 restrict downward displacement of the magnetic rings 7, 8, 10, 11 and the spacer 9 in order to prevent the protrusions 12a, 12b from being crushed.

For example, the magnetic rings 7, 8 are dipole magnets, and the magnetic rings 10, 11 are quadrapole magnets. Purity control of the CRT is performed by tuning the mutual angular position of the magnetic rings 7 and 8, and their angles with respect to the deflection yoke. Convergence control of the CRT is performed by tuning the mutual angular position of the magnetic rings 10 and 11, and their angles with respect to the deflection yoke. Tuning operation is performed manually by turning tabs 7a, 8a, 10a and 11a of the magnetic rings 7, 8, 10 and 11 respectively.

Accordingly, a pair of the magnetic rings 7 and 8, and a group of the magnetic rings 10 and 11 are required to move independently from each other, and temporarily settled at their optimum positions. After the completion of the tuning operation, the magnet rings 7, 8, 10 and 11 are fixed by applying an adhesive thereon.

For this purpose, the protrusions 12a, 12b and the claw 13a are designed, and the spacer 19 is provided as explained below.

Figure 3:
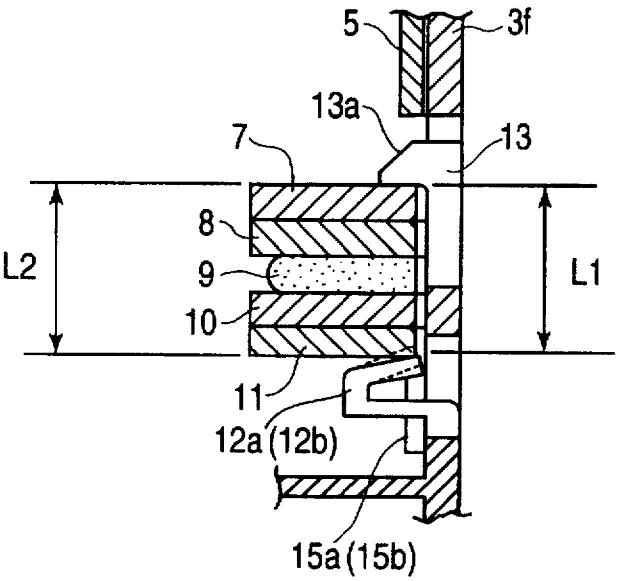
Fig. 3 PRIOR ART
FIG. 3 shows a sectional view of a part of a neck, near to the CRT, of the deflection yoke of FIG. 1.
Figure 4:
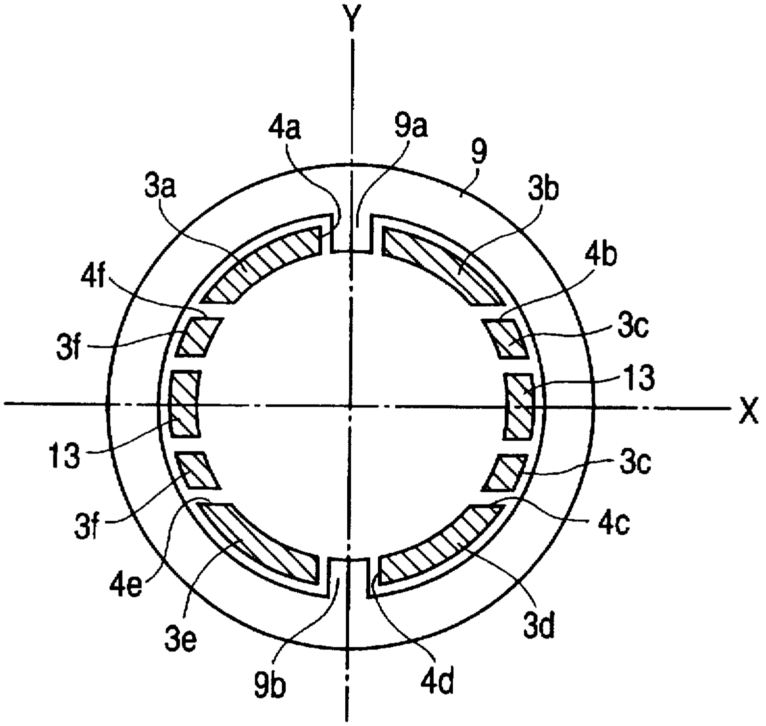
Fig. 4 PRIOR ART
FIG. 4 shows a sectional view taken along the X-Y plane of the neck of the deflection yoke of FIG. 1.

Upper and lower limits of torque for rotating and settling the magnetic rings 7, 8, 10, 11 are prescribed. As shown in FIG. 3, a space L1 between the protrusion 12a (12b)and the claw 13a is designed to be a little smaller than the total thickness of the magnetic rings 7, 8, 10 and 11, and the spacer 9, so as to obtain the adequate torque for rotating the magnetic rings 7, 8, 10 and 11. The torque results from the friction between the respective magnetic rings 7, 8, 10, 11, which are caused by a rearward spring action of elasticity of the protrusion 12a (12b).

As shown in FIGS. 8 and 9, the spacer 19 has a pair of protuberances 19a, 19a, and another pair of protuberances 19b, 19b placed opposite to the pair of protuberances 19a, 19a on its periphery.

Projections 20a, 20b are formed integrally with the pair of flanges 16a, 16b. As shown in FIG. 9, when the spacer 19 is mounted on the neck 3, the projections 20a and 20b engage with the protuberances 19a, 19a, 19b, 19b respectively. Thus the spacer 19 is securely prevented from rotating thereby, but allowed to slide in the direction of the Z axis. The spacer 19 is interposed between the pair of the magnetic rings 7, 8 and that of the magnetic rings 10, 11 so as not to interfere with the rotation of other pair. As a result, each pair of the magnetic rings 7 to 8 and 10 to 11 may be rotated independently. The projections 20a and 20b on the pair of flanges 16a, 16b are structurally and mechanically independent of the flexibility of the neck 3, which is fastened and distorted by the clamp band 5. In other words, the projections 20a and 20b are free from the deformation of the neck 3. Accordingly, the projections 20a and 20b hold the spacer 19 firmly without any slack. For instance, when the magnetic rings 10, 11 are rotated, the magnetic rings 7, 8 are not influenced thereby and keep their original positions. As a result, re-tuning of purity or of convergence of the CRT is not required.

The width of the gap of the protuberances 19a, 19a, 19b, 19b and the thickness of the projections 20a, 20b are made to be almost the same so as not to have any slack. The length of the protuberances 19a, 19a, 19b, 19b are not critical.

In the first embodiment, the protuberances 19a, 19a, 19b, 19b extend outside of the spacer 19, and can be inspected visually for their engagement with the projections 20a, 20b. Thus, the time of productivity of the deflection yoke is improved. The shape of the protuberances 19a, 19a, 19b, 19b is simple, thus a metal mold for the spacer 19 may be made easily, and has a fairly long life.

Other variations of the first embodiment will be explained hereinafter.

As shown in FIG. 10(A), a spacer 29 has protuberances 29a, 29b on the outer circumference thereof and at approximately symmetrical positions of the center thereof. The projections 21a, 21b are formed respectively on the pair of separators 1a, 1b for contacting the side walls of the protuberances 29a, 29b, which walls face the same side of the Y axis, and thus restrict the rotation of the spacer 29.

As shown in FIG. 10(B), a spacer 39 has a pair of protuberances 39a, 39a on the outer circumference. The pair of protuberances 39a, 39a engages with a projection 22, which is formed on one of the pair of flanges 16a, 16b. The construction of the above corresponds to the case wherein only one of the protuberances 39a, 39a, 39b, 39b and one of the projections 20a, 20b are utilized as shown in FIGS. 7 through 9.

As shown in FIG. 10(C), a spacer 49 has a protuberance 49a on the outer circumference thereof. The protuberance 49a engages with a pair of projections 23a, 23b formed on one of the pair of flanges 16a, 1b.

Figure 11:
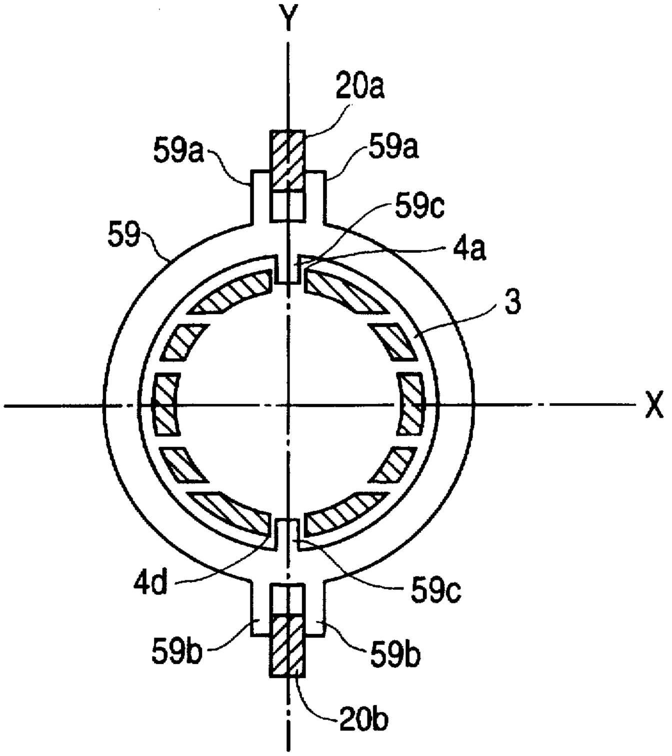
FIG. 11 shows a partial sectional view of the 1st embodiment of the present invention.

As shown in FIG. 11, a spacer 59 has protuberances 59c, 59c on the inner circumference thereof. The protuberances 59c, 59c engage with the slits 4a, 4d respectively, which act as guides for installation of the spacer 59 on the neck 3. The spacer 59 further has protuberances 59a, 59a, 59b, 59b for engaging with the projections 20a, 20b respectively, the same as those of the spacer 19. The width of the protuberances 59c, 59c is made narrower than those of the slits 4a, 4b respectively for their smooth movement along the Z-axis. This arrangement of the protuberance is applicable to the spacers 29, 39, 49 shown in FIGS. 10(A) through 10(C).

[Second embodiment]

Figure 12:
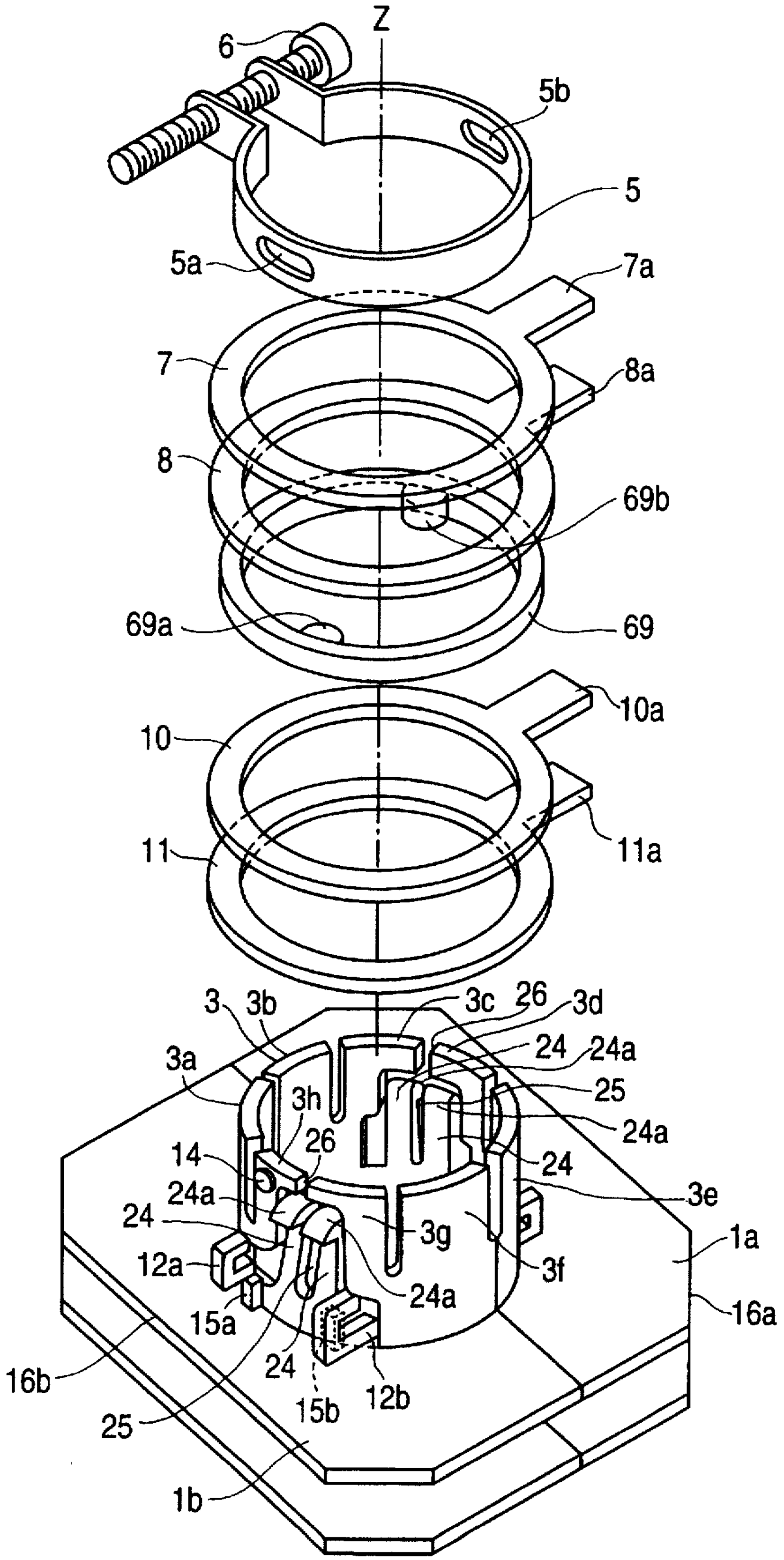
FIG. 12 shows a partial exploded view of a deflection yoke of the 2nd embodiment of the present invention.

FIG. 12 shows a partial exploded view of a deflection yoke of the 2nd embodiment of the present invention.

Figure 13:
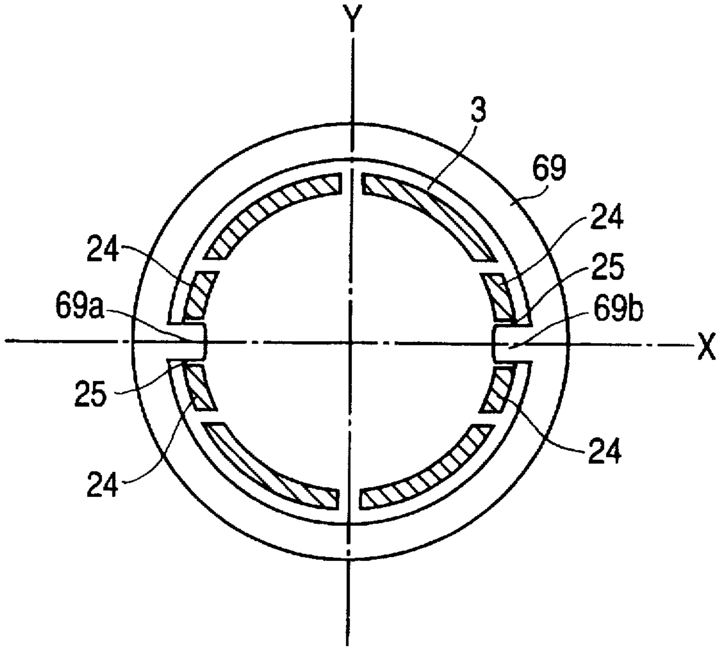
FIG. 13 shows a partial sectional view of a deflection yoke of the 2nd embodiment of the present invention.

FIG. 13 shows a partial sectional view of a deflection yoke of the 2nd embodiment of the present invention.

Figure 14:
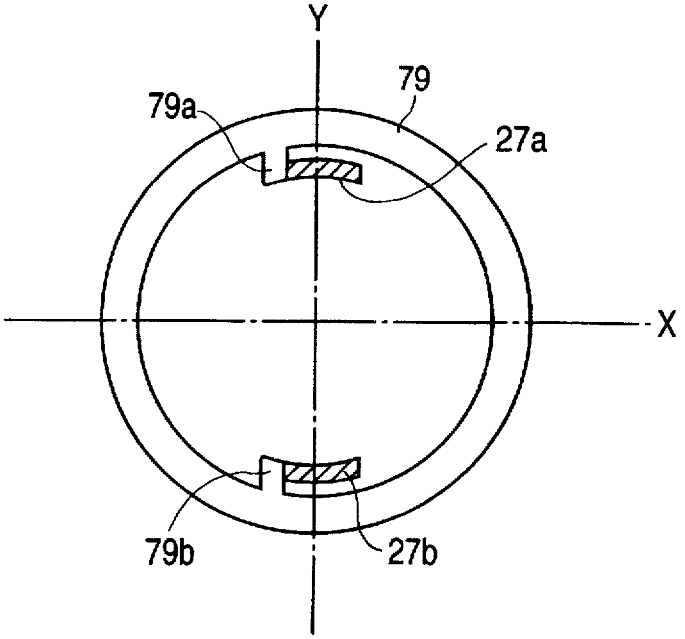
FIG. 14 shows a partial sectional view of a deflection yoke of the 2nd embodiment of the present invention.

FIG. 14 shows a partial sectional view of a deflection yoke of the 2nd embodiment of the present invention.

As shown in FIG. 12, protrusions 12a, 12b, flexible in the direction of the Z axis, are provided at the bottom end of the neck 3. On the neck 3, a pair of hooks 24, 24 having projections 24a, 24a of triangular shape at their distal ends are formed on the pair of separators 1a, 1b respectively. The pair of hooks 24, 24 have flexibility in the direction of the Z axis. The pair of hooks 24, 24 has a slit 25.

The magnetic rings 7, 8, 10, 11 and a spacer 69 are inserted into onto the neck 3 from the rear end of the neck 3, and held between the protrusions 12a, 12b and the projection 24a.

As shown in FIGS. 12 and 13, the spacer 69 of the second embodiment has protuberances 69a, 69b on the inner periphery thereof. The protuberances 69a and 69b are positioned oppositely from each other. When the spacer 69 is installed in the neck 3, the protuberances 69a, 69b are inserted in the slit 25 of the hook 24 respectively for restricting the rotation of the spacer 69. Then, the spacer 69 is allowed to slide in the direction of the Z axis. The rotation of the spacer 69 is restricted by making the width of the protuberance 69a (69b) almost equal to that of the slit 25. Thus, the spacer 69 is interposed between the pair of magnetic rings 7, 8 and that of the magnetic rings 10, 11 so as not to interfere with the rotation of other pair. As a result, each pair of the magnetic rings 7 to 8 and 10 to 11 may be rotated independently.

The hook 24 (24), formed on the neck 3, is structurally and mechanically independent of the flexibility of tongues 3a through 3h of the neck 3, which are fastened and deformed by the clamp band 5. Thus, the hook 24 (24) is free from the deformation of the neck 3. Accordingly, the hook 24 (24) holds the spacer 69 firmly without any slack. For instance, when the magnetic rings 10, 11 are rotated, the magnetic rings 7, 8 are not influenced thereby and keep their original positions. As a result, re-tuning of purity or of convergence of the CRT is not required.

Further, a slit 26 (26) is formed on the neck 3 above the slit 25 (25), for guiding an insert of the protuberance 69a (69b) thereto. The width of the slit 26 is made wider than that of the protuberance 69a (69b). If the neck 3 is flexible enough for installing the spacer 69, provision of the slit 26 may be omitted.

In this embodiment, no projections such as 20a, 20b on the separators 1a, 1b are required, thus a space availability for mounting parts on the deflection yoke is better than the case of the first embodiment.

In the second embodiment, the protuberances 69a, 69b and the slits 25, 25 on the tongues 24, 24 restrict the rotation of the spacer 69. Other means for restricting the rotation of the spacer 69 will be described hereinafter. The spacer 69 may have recesses on its circumference, and the pair of flanges 16a, 16b or the neck 3 may have projections for engaging with the recesses. In this case, one of the protuberances 69a and 69b, and one of the slits 25, 25 may be utilized for the purpose. Here, means for engaging with the protuberance or the recess on the spacer may be formed on the place of any pair of separators 1a, 1b, which is not distorted by the clamping force of the clamp band 5.

Other variations of the second embodiment will be explained hereinafter.

As shown in FIG. 14, protuberances 79a, 79b are formed on an inner periphery of a spacer 79. The protuberances 79a, 79b restrict the rotation of the spacer 79 by engaging with projections 27a, 27b provided on the pair of separators 1a, 1b, which are not deformed by the clamping force of the clamp band 5. The protuberances 79a, 79b may be formed in other shapes, and the projections 27a, 27b may be formed on any place of the pair of separators 1a, 1b, which is not deformed by the clamping force of the clamp band 5.

There may be other variations for the protuberances 79a, 79b and the projections 27a, 27b to be engaged.

As explained before, the deflection yoke of the present invention has a spacer (19, 29, 39, 49, 59, 69, 79) whose rotation is restricted by an engagement of a part of the spacer with a means formed on the pair of separators 1a, 1b or another means which is not deformed by the clamping force of the clamp band 5. Thus, problems of the prior art are solved completely.

Figure 5:
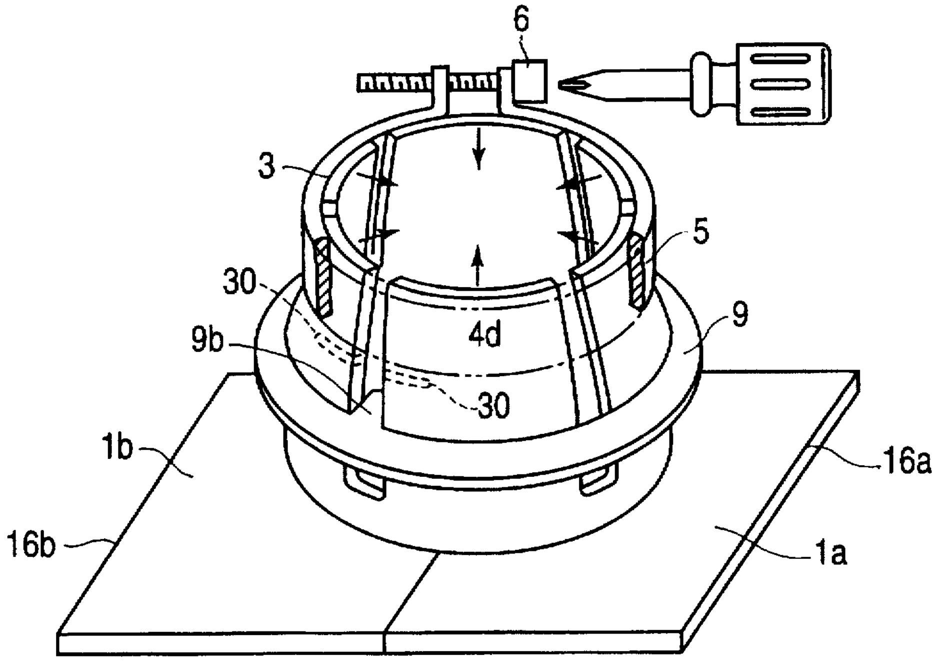
Fig. 5 PRIOR ART
FIG. 5 shows a partial perspective view of the deflection yoke of FIG. 1.
Figure 6A:
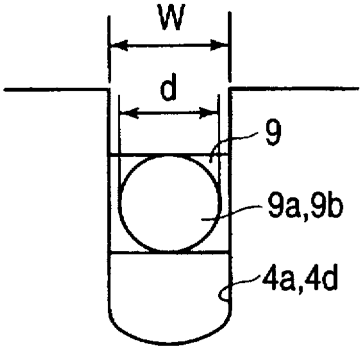
Fig. 6(A) PRIOR ART
FIGS. 6(A) and 6(B) show partial side views of a slit provided on the neck of the deflection yoke of FIG. 1.
Figure 6B:
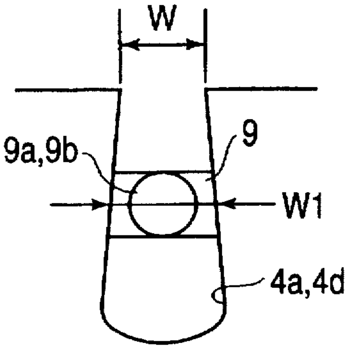
Fig. 6(B) PRIOR ART

Moreover, there is prior art deflection yoke which has grooves 30, 30 provided on an inner surface of the tongues 3a, 3b, 3d, 3e of the neck 3, shown as a dotted line in FIG. 5, for preventing the slits 4a, 4d from being narrowed by the clamping force of the clamp belt 5, as shown in FIGS. 6(A), 6(B). And, the magnetic rings 7, 8, 10, 11 and the spacer 9 are inserted in the neck 3, beyond the slits 30, 30 where the deformation of the tongues 3a, 3b, 3d, 3e is minimized. However, provision of the slits 30, 30 weakens the neck 3. The deflection yoke of the present invention needs no such slits on the neck, has an adequate strength of the neck 3, and is applicable to a deflection yoke required to have a thin wall of the neck, which is too weak to have such slits 30, 30 on the neck 3.

In the embodiments of the deflection yoke of the present invention, the spacer (19, 29, 39, 49, 59, 69, 79) is positioned between the magnetic rings 7, 8 and the magnet rings 10, 11. The spacer, or two or more of the spacers, if necessary, may be positioned in other position (positions) of the magnetic rings 7, 8, 10, 11, under the condition that the spacer (spacers) prevents (prevent) the interference between the pairs of the magnetic rings 7, 8 and 10, 11.

The magnetic rings 7, 8, 10, 11 may have other shapes, such as a gear. The magnetic rings may be used for controlling other magnetic characteristics than the convergence and the purity.

As explained before, the deflection yoke of the present invention has a spacer engaged with a catch formed on a place where it does not deform with the clamping force of the clamp. As a result, when magnetic characteristics of a CRT is tuned by turning the magnetic rings respectively, the pairs of the magnetic rings do not interfere with each other, and the tuning of the CRT is improved considerably.

What is claimed is:

1. A deflection yoke for a cathode ray tube comprising:

separator means formed in a funnel shape for supporting components of said deflection yoke and for interposing between a horizontal coil and a vertical coil, said separator means having front and rear portions, said front portion being adapted to face a screen of said cathode ray tube when said deflection yoke is mounted on said cathode ray tube;

flange means provided in said rear portion of said separator means and having a substantially flat panel shape;

a flexible cylindrical neck formed on said separator means;

a clamp adapted to be mounted on said flexible cylindrical neck for fixing said deflection yoke to said cathode ray tube by tightening said flexible cylindrical neck when said clamp is tightened;

a plurality of magnetic rings mounted on said flexible cylindrical neck for tuning magnetic characteristics of said deflection yoke;

a spacer having a first engaging means, said spacer being installed on said flexible cylindrical neck and positioned between said plurality of magnetic rings; and second engaging means formed on said flange means for engaging with said first engaging means of said spacer and restricting rotation of said spacer, whereby said flange means is not subject to deformation of said flexible cylindrical neck caused by tightening of said clamp.

2. A deflection yoke as claimed in claim 1, wherein said first engaging means is a recess and said second engaging means is a protuberance formed on said flange means.

3. A deflection yoke as claimed in claim 1, wherein said first engaging means is a protuberance and said second engaging means is a recess formed on said flange means.

4. A deflection yoke for a cathode ray tube comprising:

separator means formed in a funnel shape for supporting components of said deflection yoke and for interposing between a horizontal coil and a vertical coil, said separator means having front and rear portions, said front portion being adapted to face a screen of said cathode ray tube when said deflection yoke is mounted on said cathode ray tube;

flange means provided in said rear portion of said separator means and having a substantially flat panel shape;

a flexible cylindrical neck formed on said separator means;

a clamp adapted to be mounted on said flexible cylindrical neck for fixing said deflection yoke to said cathode ray tube by tightening said flexible cylindrical neck when said lamp is tightened;

a plurality of magnetic rings mounted on said flexible cylindrical neck for tuning magnetic characteristics of said deflection yoke;

a spacer having a first engaging means, said spacer being installed on said flexible cylindrical neck and positioned between said plurality of magnetic rings; and second engaging means formed on said flange means for engaging with said first engaging means of said spacer and restricting rotation of said spacer.

5. A deflection yoke as claimed in claim 4, wherein said first engaging means is a recess and said second engaging means is a protuberance formed on said flange means.

6. A deflection yoke as claimed in claim 4, wherein said first engaging means is a protuberance and said second engaging means is a recess formed on said flange means.

7. A deflection yoke for a cathode ray tube comprising:

supporting means formed in a funnel shape for supporting components of said deflection yoke, said supporting means having front and rear portions, said front portion being adapted to face a screen of said cathode ray tube when said deflection yoke is mounted on said cathode ray tube;

flange means provided in said rear portion of said separator means and having a substantially flat panel shape;

a flexible cylindrical neck formed on said supporting means;

a clamp adapted to be mounted on said flexible cylindrical neck for fixing said deflection yoke to said cathode ray tube by tightening said flexible cylindrical neck when said clap is tightened;

a plurality of magnetic rings mounted on said flexible cylindrical neck for tuning magnetic characteristics of said deflection yoke;

a spacer having a first engaging means, said spacer being installed on said flexible cylindrical neck and positioned between said plurality of magnetic rings; and second engaging means formed on said flange means for engaging with said first engaging means of said spacer and restricting rotation of said spacer, whereby said flange means is not subject to deformation of said flexible cylindrical neck caused by tightening of said clamp.

8. A deflection yoke as claimed in claim 7, wherein said first engaging means is a recess and said second engaging means is a protuberance formed on said flange means.

9. A deflection yoke as claimed in claim 7, wherein said first engaging means is a protuberance and second engaging means is a recess formed on said flange means.

* * * * *